(12) United States Patent
Kum et al.

(10) Patent No.: US 9,595,637 B2
(45) Date of Patent: Mar. 14, 2017

(54) NANOSTRUCTURE SEMICONDUCTOR LIGHT EMITTING DEVICE HAVING ROD AND CAPPING LAYERS OF DIFFERING HEIGHTS

(71) Applicant: Samsung Electronics Co., Ltd., Suwon-si, Gyeonggi-do (KR)

(72) Inventors: Hyun Seong Kum, Hwaseong-si (KR); Dae Myung Chun, Hwaseong-si (KR); Ji Hye Yeon, Cheongju-si (KR); Han Kyu Seong, Seoul (KR); Jin Sub Lee, Suwon-si (KR); Young Jin Choi, Seoul (KR); Jae Hyeok Heo, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 14/920,509

(22) Filed: Oct. 22, 2015

(65) Prior Publication Data
US 2016/0126419 A1    May 5, 2016

(30) Foreign Application Priority Data
Nov. 3, 2014    (KR) .................. 10-2014-0151379

(51) Int. Cl.
*H01L 33/24*    (2010.01)
*H01L 33/08*    (2010.01)
(Continued)

(52) U.S. Cl.
CPC .............. *H01L 33/24* (2013.01); *H01L 33/08* (2013.01); *H01L 33/007* (2013.01); *H01L 33/20* (2013.01);
(Continued)

(58) Field of Classification Search
CPC ........ H01L 33/08; H01L 33/24; H01L 33/325
See application file for complete search history.

(56) References Cited

U.S. PATENT DOCUMENTS 6,372,608 B1    4/2002 Shimoda et al.
6,645,830 B2    11/2003 Shimoda et al.
(Continued)

FOREIGN PATENT DOCUMENTS

JP    2008166567 A    7/2008
JP    2009009977 A    1/2009
(Continued)

OTHER PUBLICATIONS

Anders Lundskog et al., "Controlled growth of hexagonal GaN pyramids by hot-wall MOCVD", Journal of Crystal Growth 363 (2013) 287-293, Nov. 2012.

*Primary Examiner* — Scott B Geyer
*Assistant Examiner* — Brigitte Paterson
(74) *Attorney, Agent, or Firm* — Harness, Dickey & Pierce, PLC

(57) ABSTRACT

There is provided a semiconductor light-emitting device including a base layer formed of a first conductivity-type semiconductor material, and a plurality of light-emitting nanostructures disposed on the base layer to be spaced apart from each other, and including first conductivity-type semiconductor cores, active layers, and second conductivity-type semiconductor layers. The first conductivity-type semiconductor cores include rod layers extending upwardly from the base layer, and capping layers disposed on the rod layers. Heights of the rod layers are different in at least a portion of the plurality of light-emitting nanostructures, and heights of the capping layers are different in at least a portion of the plurality of light-emitting nanostructures.

15 Claims, 19 Drawing Sheets

(51) Int. Cl.
  *H01L 33/00* (2010.01)
  *H01L 33/20* (2010.01)
  *H01L 33/32* (2010.01)
  *H01L 33/42* (2010.01)
  *H01L 33/44* (2010.01)

(52) U.S. Cl.
  CPC .............. *H01L 33/32* (2013.01); *H01L 33/42* (2013.01); *H01L 33/44* (2013.01)

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,679,881 B1 | 3/2014 | Chyi et al. |
| 8,735,931 B2 | 5/2014 | Han et al. |
| 8,766,295 B2 | 7/2014 | Kim |
| 2008/0036038 A1 | 2/2008 | Hersee et al. |
| 2009/0098714 A1 | 4/2009 | Chang et al. |
| 2012/0068153 A1 | 3/2012 | Seong et al. |
| 2013/0341658 A1 | 12/2013 | Lee et al. |
| 2015/0263227 A1* | 9/2015 | Yang .................. H01L 33/08 257/88 |
| 2016/0013365 A1 | 1/2016 | Chun et al. |

FOREIGN PATENT DOCUMENTS

| | | |
|---|---|---|
| JP | 2010135859 A | 6/2010 |
| KR | 101019941 B1 | 3/2011 |
| KR | 20120028103 A | 3/2012 |
| KR | 2016-0008027 A | 1/2016 |

* cited by examiner

US 9,595,637 B2

NANOSTRUCTURE SEMICONDUCTOR LIGHT EMITTING DEVICE HAVING ROD AND CAPPING LAYERS OF DIFFERING HEIGHTS

CROSS-REFERENCE TO RELATED APPLICATION

This application claims the priority and benefit of Korean Patent Application No. 10-2014-0151379 filed on Nov. 3, 2014, with the Korean Intellectual Property Office, the inventive concept of which is incorporated herein by reference.

BACKGROUND

The present inventive concepts relate to a semiconductor light-emitting device and a method of manufacturing the same.

Light-emitting diodes (LEDs) are known as next-generation light sources due to advantages thereof, such relatively long lifespans, low power consumption, fast response times, and/or environmental friendliness, as compared to conventional light sources. In addition, LEDs are prominent as important light sources in various products, such as illumination apparatuses or the backlights of display devices. For example, LEDs based on group III nitrides, such as gallium nitride (GaN), aluminum gallium nitride (AlGaN), indium gallium nitride (InGaN), or indium aluminum gallium nitride (InAlGaN), may have an important role as semiconductor light-emitting devices emitting blue light or ultraviolet light.

Recently, the application area of LEDs has been further broadened to encompass light sources for higher-current/higher-power applications. Due to such needs for LEDs in higher-current/higher-power applications, research into improving light-emission characteristics has continued. For example, in order to improve light emission efficiency by increasing crystallinity and/or light-emitting areas, a semiconductor light-emitting device including light-emitting nanostructures and a method of manufacturing the semiconductor light-emitting device have been proposed.

SUMMARY

An aspect of the present inventive concepts may provide a semiconductor light-emitting device having improved light emission efficiency.

According to an aspect of the present inventive concepts, a semiconductor light-emitting device may include a base layer formed of a first conductivity-type semiconductor material, and a plurality of light-emitting nanostructures disposed on the base layer to be spaced apart from each other and including first conductivity-type semiconductor cores, active layers, and second conductivity-type semiconductor layers. The first conductivity-type semiconductor cores may include rod layers extending upwardly from the base layer, and capping layers disposed on the rod layers. Heights of the rod layers may be different in at least a portion of the plurality of light-emitting nanostructures, and heights of the capping layers are different in at least a portion of the plurality of light-emitting nanostructures.

In some example embodiments, heights from an upper surface of the base layer to tops of the capping layers in the plurality of light-emitting nanostructures may be substantially the same.

In some example embodiments, as distances between adjacent light-emitting nanostructures increase, the heights of the capping layers of the light-emitting nanostructures may decrease.

In some example embodiments, a standard deviation of widths of the first conductivity-type semiconductor cores in the plurality of light-emitting nanostructures may be 3% or less of an average width thereof.

In some example embodiments, the standard deviation of widths of the first conductivity-type semiconductor cores may be 10 nm or less.

In some example embodiments, the plurality of light-emitting nanostructures may be arranged at different distances in different regions.

In some example embodiments, the plurality of light-emitting nanostructures may include bodies having a hexagonal prism shape, and upper tips having a hexagonal pyramid shape and disposed on the bodies. The capping layers may configure portions of the bodies and the upper tips.

In some example embodiments, the rod layers and capping layers in the bodies may have inclined side surfaces.

In some example embodiments, the plurality of light-emitting nanostructures may further include a high resistance layer disposed to contact the active layers on the upper tips thereof.

In some example embodiments, the capping layers may extend upwardly of the rod layers and include portions whose widths discontinuously change.

In some example embodiments, the first conductivity-type semiconductor cores may further include cover layers disposed outside of the rod layers and the capping layers.

In some example embodiments, the plurality of light-emitting nanostructures may include bodies having a hexagonal prism shape, and upper tips having a hexagonal pyramid shape and disposed on the bodies. Lower portions of the cover layers in the bodies may have greater thicknesses than upper portions thereof.

In some example embodiments, the rod layers and the capping layers may be formed of nitride-based semiconductor materials having different compositions.

In some example embodiments, the rod layers and the capping layers may include impurities having different concentration levels.

In some example embodiments, the rod layers and the capping layers may have different levels of crystallinity.

According to another aspect of the present inventive concepts, a method of manufacturing a semiconductor light-emitting device may include forming a first conductivity-type semiconductor base layer on a substrate, forming a mask layer and a mold layer including a plurality of openings exposing portions of the base layer on the base layer, forming a plurality of first-conductivity type semiconductor cores including bodies extending through the openings from the base layer and upper tips having a hexagonal pyramid shape and disposed on the bodies, and sequentially forming active layers and second conductivity-type semiconductor layers on the plurality of first-conductivity type semiconductor cores. The forming of the plurality of first-conductivity type semiconductor cores may include forming rod layers extending from the base layer into the openings, and forming capping layers filling the openings and extending upwardly from the mold layer.

In some example embodiments, the capping layer may be grown until it is saturated.

According to an aspect of the present inventive concepts, a semiconductor light-emitting core may include: at least one rod layer, and at least one capping layer on the at least one rod layer, the at least one capping layer limiting a growth height of the semiconductor light-emitting core.

In some example embodiments, the at least one capping layer may have a width greater than a width of the at least one rod layer.

In some example embodiments, the semiconductor light-emitting core may further include at least one cover layer surrounding the at least one rod layer and the at least one capping layer.

In some example embodiments, the at least one capping and the at least one rod layer may be formed of n-type GaN and the at least one cover layer may be formed of n-type InGaN or n-type AlGaN.

In some example embodiments, the at least one capping, the at least one rod layer, and the at least one cover layer may have different degrees of crystallinity.

BRIEF DESCRIPTION OF DRAWINGS

The above and other aspects, features and advantages of the present inventive concepts will be more clearly understood from the following detailed description taken in conjunction with the accompanying drawings, in which.

DETAILED DESCRIPTION

Figure 1:
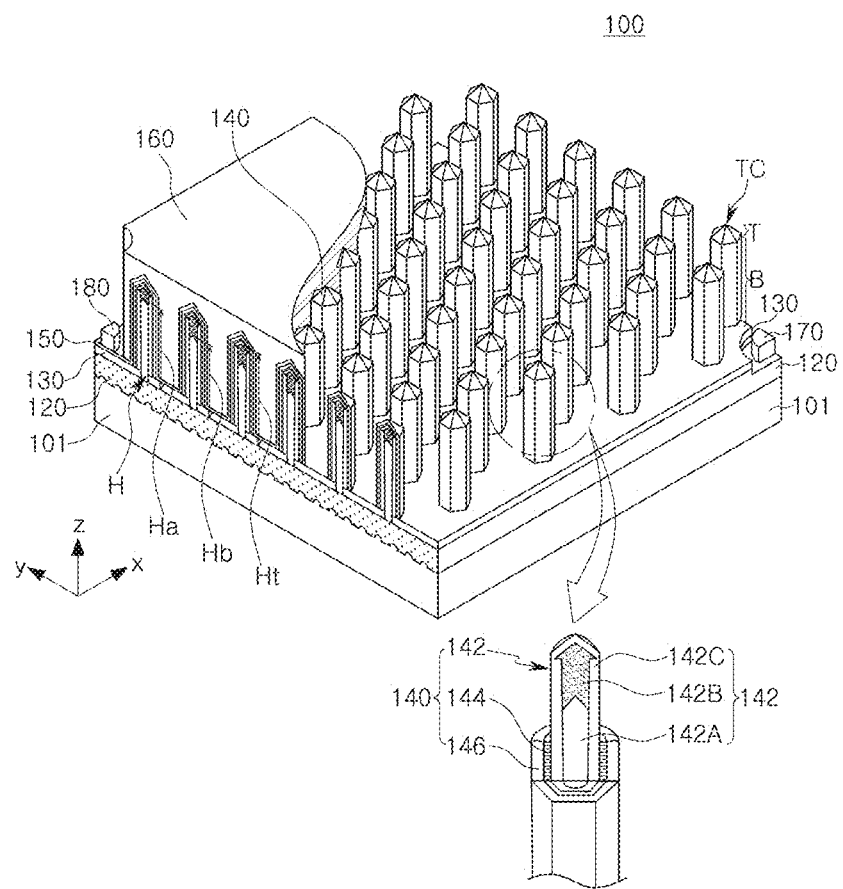
FIG. 1 is a perspective view schematically illustrating a semiconductor light-emitting device according to an example embodiment of the present inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, example embodiments of the inventive concepts are not limited to the specific examples provided herein and are exaggerated for clarity.

The terminology used herein is for the purpose of describing example embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, example embodiments in the detailed description will be described with sectional views as ideal example views of the inventive concepts. Accordingly, shapes of the example views may be modified according to manufacturing techniques and/or allowable errors. Therefore, example embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some example embodiments could be termed a second element in other example embodiments without departing from the teachings of the present invention. Example embodiments of aspects of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various example embodiments described herein may be embodied in microelectronic devices such as integrated circuits, wherein a plurality of devices according to various example embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various example embodiments described herein may include a plurality of the devices in an array and/or in a two-dimensional pattern that is based on the functionality of the microelectronic device.

The devices according to various example embodiments described herein may be interspersed among other devices depending on the functionality of the microelectronic device. Moreover, microelectronic devices according to various example embodiments described herein may be replicated in a third direction that may be orthogonal to the two different directions, to provide three-dimensional integrated circuits.

Accordingly, the cross-sectional view(s) illustrated herein provide support for a plurality of devices according to various example embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a perspective view schematically illustrating a semiconductor light-emitting device according to an example embodiment of the present inventive concepts.

Referring to FIG. 1, a semiconductor light-emitting device 100 may include a substrate 101, a base layer 120 formed on the substrate 101, a mask layer 130, a light-emitting nanostructures 140, a transparent electrode layer 150, and/or a filling layer 160. The light-emitting nanostructures 140 may include first conductivity-type semiconductor cores 142 grown from the first conductivity-type semiconductor base layer 120, active layers 144, and second conductivity type semiconductor layers 146. The semiconductor light-emitting device 100 may further include first and second electrodes 170 and 180 electrically connected to the base layer 120 and the second conductivity type semiconductor layers 146.

In FIG. 1, some components, such as the transparent electrode layer 150 and the filling layer 160, are illustrated in part, and some components, such as the light-emitting nanostructures 140, are illustrated in a cross-section in one end according to a x-axis direction, for easier understanding.

The substrate 101 may be provided as a growth substrate for a semiconductor material. The substrate 101 may be an insulating material, a conductive material, or a semiconductor material, such as sapphire, SiC, $MgAl_2O_4$, MgO, $LiAlO_2$, $LiGaO_2$, and GaN. Sapphire, is a crystal having Hexa-Rhombo R3c symmetry, has a lattice constant of 13.001 Å in a c-axis orientation and 4.758 Å in an a-axis orientation, and has a C-plane (0001), an A-plane (11-20), an R-plane (1-102), and the like. In some example embodiments, since the C-plane allows a nitride thin film to be relatively easily grown thereon and is stable even at high temperatures, sapphire is predominantly utilized as a growth substrate for a nitride-based semiconductor. Meanwhile, when a Si substrate is used as the substrate 101, since the Si substrate is appropriate for obtaining a large diameter and has relatively low manufacturing costs, mass manufacturing characteristics may be improved.

Uneven structures may be formed on a surface of the substrate 101 to improve light extraction efficiency. Shapes of the uneven structures may not be limited to that illustrated in FIG. 1. In some example embodiments, a buffer layer may further be disposed on the substrate 101 to improve crystallinity of the base layer 120. The buffer layer may be, for example, formed of an aluminum gallium nitride ($Al_xGa_{1-x}N$) grown at a low temperature without doping.

In some example embodiments, the substrate 101 may be removed or omitted. For example, when the semiconductor light-emitting device 100 is mounted on an external apparatus such as a package substrate, the substrate 101 may be removed, and even when Si is used for the substrate 101, the substrate 101 may be removed in a subsequent process.

The base layer 120 may be disposed on the substrate 101. The base layer 120 may be formed of a conductive material. The base layer 120 may be a group III-V compound, such as GaN or n-type n-GaN doped with n-type impurities.

In some example embodiments, the base layer 120 may not only provide a crystal plane for growing the first conductivity-type semiconductor cores 142 of the light-emitting nanostructures 140, but also function as a contact electrode by being commonly connected to one ends of respective light-emitting nanostructures 140.

The mask layer 130 may be disposed on the base layer 120. The mask layer 130 may be formed of silicon oxide or silicon nitride. For example, the mask layer 130 may be formed of at least one of silicon oxide ($SiO_x$), silicon oxynitride ($SiO_xN_y$), silicon nitride ($Si_xN_y$), aluminum oxide ($Al_2O_3$), titanium nitride (TiN), aluminum nitride (AlN), zirconium oxide (ZrO), titanium aluminum nitride (TiAlN), and titanium silicon nitride (TiSiN). For example, the mask layer 130 may be a distributed Bragg reflector (DBR) layer or an omni-directional reflector (ODR) layer. In some example embodiments, the mask layer 130 may have a structure in which layers having different refractive indexes are alternately stacked, but is not limited thereto. In some example embodiments, the mask layer 130 may be a single layer.

The mask layer 130 may include a plurality of openings H exposing portions of the base layer 120. Depending on sizes of the plurality of openings H, diameters, lengths, positions, and growth conditions of the light-emitting nanostructures 140 may be determined. The plurality of openings H may have a variety of shapes, such as circular, tetragonal, or hexagonal shapes.

The plurality of light-emitting nanostructures 140 may be disposed in locations corresponding to the plurality of openings H. The light-emitting nanostructures 140 may have a core-shell structure including the first conductivity-type semiconductor cores 142 grown from the base layer 120 exposed by the plurality of openings H, and active layers 144 and second conductivity type semiconductor layers 146 sequentially grown on surfaces of the first conductivity-type semiconductor cores 142. As illustrated in FIG. 1, widths of the first conductivity-type semiconductor cores 142 may be greater than widths of the plurality of openings H of the mask layer 130, but are not limited thereto.

The first conductivity-type semiconductor cores 142 and the second conductivity type semiconductor layers 146 may be formed of semiconductor materials doped with n-type and p-type impurities, but are not limited thereto. The first conductivity-type semiconductor cores 142 and the second conductivity type semiconductor layers 146 may be formed of an n-type semiconductor material and a p-type semiconductor material. The first conductivity-type semiconductor cores 142 and the second conductivity type semiconductor layers 146 may be formed of a nitride semiconductor material, for example, aluminum indium gallium nitride having a composition of $Al_xIn_yGa_{1-x-y}N$ ($0 \leq x \leq 1$, $0 \leq y \leq 1$, and $0 \leq x+y \leq 1$). Each of the first conductivity-type semiconductor cores 142 and the second conductivity type semiconductor layers 146 may be formed as a single layer, or include a plurality of layers having different characteristics, such as doping concentrations or compositions. However, the first conductivity-type semiconductor cores 142 and the second conductivity type semiconductor layers 146 may be formed of an aluminum indium gallium phosphate (AlInGaP)-based or aluminum indium gallium arsenide (AlInGaAs)-based semiconductor material as well as the nitride semiconductor material. In the example embodiment, the first conductivity-type semiconductor cores 142 may be, for example, n-type gallium nitride (n-GaN) doped with Si or C, and the second conductivity type semiconductor layers 146 may be, for example, p-type gallium nitride (p-GaN) doped with Mg or Zn.

The active layers 144 may be disposed on surfaces of the first conductivity-type semiconductor cores 142. The active layers 144 may emit light having a predetermined and/or desired amount of energy by electron-hole recombination, and be formed of a single material such as indium gallium nitride (InGaN). Alternatively, the active layers 144 may have a single quantum well (SQW) or a multi-quantum well (MQW) structure in which quantum well layers and quantum barrier layers are alternately stacked. For example, when the active layers 144 are a nitride semiconductor, a GaN/InGaN structure may be used. When the active layers 144 includes InGaN, crystal defects due to lattice mismatch may be reduced by increasing a content of In, and internal quantum efficiency of the semiconductor light-emitting device 100 may increase. In addition, a wavelength of emitted light may be controlled depending on an In content of the active layers 144.

The number of light-emitting nanostructures 140 included in the semiconductor light-emitting device 100 may not be limited to the number illustrated in FIG. 1, and the semiconductor light-emitting device 100 may include several tens to several millions of light-emitting nanostructures 140. The plurality of light-emitting nanostructures 140 may have a hexagonal shape.

The plurality of light-emitting nanostructures 140 may include bodies B having a hexagonal prism shape and upper tips T having a hexagonal pyramid shape, disposed on the mask layer 130. The bodies B and the upper tips T may be referred to as the same terms in each of the first conductivity-type semiconductor cores 142, the active layers 144, and the second conductivity type semiconductor layers 146, configuring the light-emitting nanostructures 140. For example, in the first conductivity-type semiconductor cores 142, the bodies B may extend from the base layer 120 onto the mask layer 130. Since the light-emitting nanostructures 140 have such a three-dimensional shape, light-emitting area may be relatively large, and thus light emission efficiency may be improved.

The bodies B of the light-emitting nanostructures 140 may have m-crystal planes, and the upper tips T may have r-crystal planes. The bodies B may have, for example, heights of 2.5 μm to 4 μm, and the upper tips T may have, for example, heights of 300 nm to 600 nm. In each of the plurality of light-emitting nanostructures 140, a vertex TC of the hexagonal pyramid of the upper tip T may be disposed on a central vertical axis, that is, an axis passing through a center of the light-emitting nanostructure 140 in a z-direction, or adjacent to the central vertical axis. Widths of the light-emitting nanostructures 140 may vary, depending on wavelengths of light emitted from the light-emitting nanostructures 140. For example, the widths of the light-emitting nanostructures 140 may be in a range of 700 nm to 1.3 μm. Hereinafter, the width of each of the light-emitting nanostructures 140 may refer to a length of a diagonal line passing through a center of the body B on a plane parallel to an upper surface of the substrate 101. When the body B does not have a regular hexagonal shape, the width of each of the light-emitting nanostructures 140 may refer to a maximum length passing thorough the center of the body B.

The first conductivity-type semiconductor cores 142 according to example embodiments of the present inventive concepts may be formed by a plurality of process steps, and thus include rod layers 142A, capping layers 142B, and cover layers 142C, formed in different process steps.

The rod layers 142A may extend upwardly of the base layer 120 and form portions of the bodies B of the first conductivity-type semiconductor cores 142. Upper portions of the rod layers 142A may have a pyramid shape. The capping layers 142B may extend from the rod layers 142A, and form portions of the bodies B and upper tips T of the first conductivity-type semiconductor cores 142. Each of the capping layers 142B may extend from the body B toward the upper tip T, and have a portion in which a width thereof increases discontinuously. The rod layers 142A and the capping layers 142B may have inclined side surfaces with respect to the upper surface of the substrate 101, but are not limited thereto.

The rod layers 142A may have different heights in at least a portion of the plurality of light-emitting nanostructures 140, and the capping layers 142B may have different heights in at least a portion of the plurality of light-emitting nanostructures 140. For example, in an end portion of the semiconductor light emitting device 100, a height Ha of a rod layer 142A in a light-emitting nanostructure 140 disposed adjacent to the second electrode 180 may be greater than heights Hb of a rod layers 142A in adjacent other light-emitting nanostructures 140. The heights of the rod layers 142A and the capping layers 142B may change depending on, for example, distances between adjacent light-emitting nanostructures 140 while the light-emitting nanostructures 140 are being grown. For example, as the distance between the adjacent light-emitting nanostructures 140 increases, the height of the rod layers 142A may increase and the height of the capping layers 142B may decrease. Such differences in heights of the rod layers 142A and the capping layers 142B according to the differences in distances therebetween may occur in the light-emitting nanostructures 140 disposed in different areas in a single semiconductor light-emitting device 100.

Even when the heights of the rod layers 142A and the capping layers 142B are different in the plurality of light-emitting nanostructures 140, the heights Ht from the upper surface of the substrate 101 to tops of the capping layers 142B or the height from an upper surface of the base layer 120 to the tops of the capping layers 142B may be substantially the same in the plurality of light-emitting nanostructures 140. That is, when a height of a rod layer 142A in one of the plurality of light-emitting nanostructures 140 is relatively larger, a height of a capping layer 142B in the one of the plurality of light-emitting nanostructures 140 may be relatively small. Accordingly, the height Ht from the upper surface of the substrate 101 to the tops of the capping layers 142B may become substantially the same in different light-emitting nanostructures 140.

The cover layers 142C may be disposed to surround the rod layers 142A and the capping layers 142B. The cover layers 142C may have side surfaces perpendicular to the substrate 101. The cover layers 142C may be grown to have a uniform thickness from the plurality of light-emitting nanostructures 140.

The plurality of first conductivity-type semiconductor cores 142 may have variations in sizes and shapes due to variations in sizes of the openings H, differences in pattern densities by area, or the like. However, according to the example embodiment of the present inventive concepts, heights of the first conductivity-type semiconductor cores 142 in the plurality of light-emitting nanostructures 140 may be substantially the same. Accordingly, widths of the first conductivity-type semiconductor cores 142 in the plurality of light-emitting nanostructures 140 may be substantially the same. A standard deviation of the widths of the first conductivity-type semiconductor cores 142 may be 3% or less of the average width thereof. For example, when the widths of the first conductivity-type semiconductor cores 142 are in the range of about 400 nm to about 480 nm, the standard deviation thereof may be 10 nm or less. Since the first conductivity-type semiconductor cores 142 have uniform size and shape, the light-emitting nanostructures 140 may have uniform size and shape.

Relative thicknesses of the rod layers 142A, the capping layers 142B, and the cover layers 142C may not be limited to those illustrated in FIG. 1. In addition, relative heights of the rod layers 142A and the capping layers 142B may not be limited to those illustrated in FIG. 1.

The rod layers 142A, the capping layers 142B, and the cover layers 142C may be formed of different materials having different compositions or include impurities having different concentrations. For example, the rod layers 142A and the cover layers 142C may be formed of n-type GaN, and the capping layers 142B may be formed of n-type InGaN or n-type AlGaN. However, the present inventive concepts are not limited thereto and, in some example embodiments, the rod layers 142A, the capping layers 142B, and the cover layers 142C may be formed of a material having the same composition. In some example embodiments, the rod layers 142A, the capping layers 142B, and the cover layers 142C may have different degrees of crystallinity. For example, the rod layers 142A and the capping layers 142B may be formed under different process conditions, resulting in differences in density, density of internal defects, resistivity, or the like.

The transparent electrode layer 150 may be electrically connected to the second conductivity type semiconductor layers 146. The transparent electrode layer 150 may cover upper and side surfaces of the light-emitting nanostructures 140 and be continuous between adjacent light-emitting nanostructures 140. The transparent electrode layer 150 may be, for example, indium tin oxide (ITO), aluminum-doped zinc oxide (AZO), indium zinc oxide (IZO), zinc oxide (ZnO), gallium-doped zinc oxide (ZnO:Ga, GZO), indium oxide ($In_2O_3$), tin oxide ($SnO_2$), cadmium oxide (CdO), cadmium tin oxide ($CdSnO_4$), or gallium oxide ($Ga_2O_3$).

The filling layer 160 may be disposed on the transparent electrode layer 150. The filling layer 160 may fill spaces between the adjacent light-emitting nanostructures 140, and cover the transparent electrode layer 150. In some example embodiments, an upper surface of the filling layer 160 may be curved along the light-emitting nanostructures 140.

The filling layer 160 may be formed of a light-transmissive insulating material. For example, the filling layer 160 may include silicon dioxide ($SiO_2$), silicon nitride ($SiN_x$), aluminum oxide ($Al_2O_3$), hafnium oxide (HfO), titanium oxide ($TiO_2$), or zirconium oxide (ZrO). Alternatively, in some example embodiments, the filling layer 160 may include a conductive material. In some example embodiments, the filling layer 160 may be electrically connected to the second electrode 180, or integrally formed with the second electrode 180. The semiconductor light-emitting device 100 may be mounted in a flip-chip structure such that the first and second electrodes 170 and 180 face an external substrate such as a package substrate.

In some example embodiments, a passivation layer may be further disposed on the filling layer 160. The passivation layer may expose upper surfaces of the first and second electrodes 170 and 180.

The first and second electrodes 170 and 180 may be disposed on the base layer 120 and the transparent electrode layer 150 in respective side portions of the semiconductor light-emitting device 100 so as to be electrically connected to the base layer 120 and the second conductivity type semiconductor layers 146. However, the arrangement and shapes of the first and second electrodes 170 and 180 are only provided as an example, and may be variously changed according to embodiments of the present inventive concepts. For example, the first and second electrodes 170 and 180 may have shapes having electrode pads and electrode fingers extending from the electrode pads. In some example embodiments, when the substrate 101 is formed of a conductive material, the first electrode 170 may be disposed on a lower surface of the substrate 101 or omitted.

The first and second electrodes 170 and 180 may have a single or multiple layer structure of the conductive material. For example, the first and second electrodes 170 and 180 may include at least one of Au, Ag, Cu, Zn, Al, In, Ti, Si, Ge, Sn, Mg, Ta, Cr, W, Ru, Rh, Ir, Ni, Pd, Pt, or an alloy thereof.

FIGS. 2A to 2I are cross-sectional views schematically illustrating a method of manufacturing a semiconductor light-emitting device according to an example embodiment of the present inventive concepts. In FIGS. 2A to 2I, for convenience of description, the light-emitting nanostructures 140 disposed in different areas of the semiconductor light-emitting device 100 of FIG. 1 are illustrated as being arranged in a row.

Figure 2A:
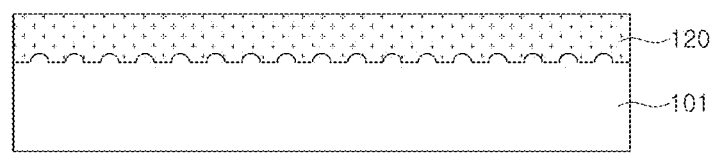
FIGS. 2A to 2I are cross-sectional views schematically illustrating a method of manufacturing a semiconductor light-emitting device according to an example embodiment of the present inventive concepts.

Referring to FIG. 2A, uneven structure may be formed on an upper surface of the substrate 101, and a first conductivity-type semiconductor may be grown on the substrate 101 to form a base layer 120.

The base layer 120 may be provided not only as a growth plane for the light-emitting nanostructures 140 (refer to FIG. 1) but also as a structure electrically connecting one ends of the light-emitting nanostructures 140. Accordingly, the base layer 120 may be formed of a semiconductor single crystal having an electrical conductivity. In some example embodiments, the substrate 101 may be a crystal growth substrate.

Figure 2B:
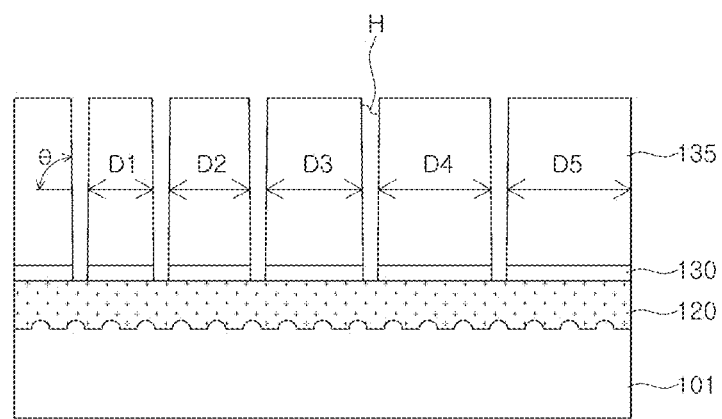

Referring to FIG. 2B, a mask layer 130 and mold layer 135 having a plurality of openings H exposing the base layer 120, may be formed on the base layer 120.

The mask layer 130 and the mold layer 135 may be formed by sequentially depositing a mask layer-forming material and a mold layer-forming material and patterning thereof using an additional mask pattern to form the plurality of openings H.

Distances between the plurality of openings H may be different, which are first to fifth distances D1 to D5. That is, the first distance D1 may be the shortest, the distances may sequentially increase, and the fifth distance D5 may be the longest. Here, the light-emitting nanostructures 140 disposed at different areas or having different surrounding arrangement in the semiconductor light-emitting device 100 of FIG. 1 are intentionally illustrated as being arranged in a row in FIGS. 2A to 2I in order to show them altogether in one figure, and the number or relative lengths of the different distances D1 to D5 are only exemplarily provided and are not limited to those illustrated in the drawings.

The plurality of openings H may have a shape of a cylinder whose diameter decreases toward a bottom thereof. Accordingly, side surfaces of the plurality of openings H may have a predetermined and/or desired angle of inclination θ with respect to the upper surface of the substrate 101. The angle of inclination θ may be, for example, 70 degrees to 90 degrees.

The mask layer 130 and the mold layer 135 may be formed of materials having different etch rate in a specific etching condition. The mask layer 130 and the mold layer 135 may also be formed of materials having different etch rate from the base layer 120. Thus, an etching process may be controlled during formation of the plurality of openings H. For example, the mask layer 130 may be formed of silicon nitride (SiN), and the mold layer 135 may be formed of silicon dioxide ($SiO_2$).

The total thicknesses of the mask layer 130 and the mold layer 135 may be designed in consideration of the thickness of the light-emitting nanostructures 140 (refer to FIG. 1). In addition, sizes of the plurality of openings H may be designed in consideration of a target size of the light-emitting nanostructures 140.

Figure 2C:
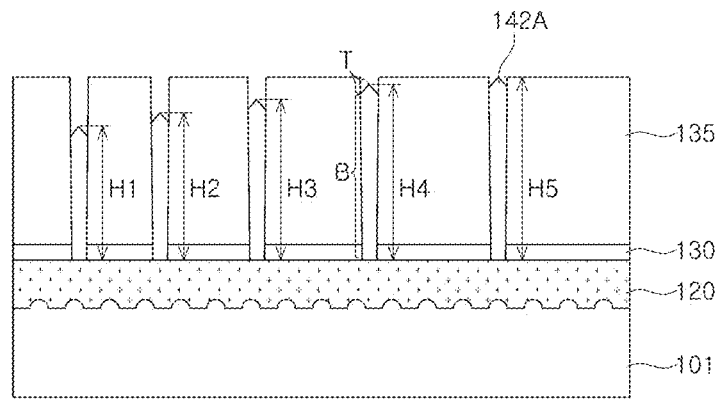

Referring to FIG. 2C, first conductivity-type semiconductors may be grown from the base layer 120 exposed through the plurality of openings H to form rod layers 142A of the plurality of first conductivity-type semiconductor cores 142 (refer to FIG. 1).

The rod layers 142A may be controlled to be grown within the mold layer 135 and not to protrude from the mold layer 135. The rod layers 142A may have inclined side surfaces so as to have greater upper diameters, similarly to the plurality of openings H. In addition, when the plurality of openings H have the cylindrical shape, bodies B of the rod layers 142A may have the cylindrical shape and upper tips T of the rod layers 142A may have a hexagonal pyramid or cone shape in which some edges are not completely formed.

The rod layers 142A may be grown to have first to fifth heights H1 to H5 depending on a distance between the adjacent rod layers 142A. As the distance between the adjacent rod layers 142A increases, the height of grown rod layers 142A may increase. That is, the first height H1 may be the shortest, the heights sequentially may increase, and the fifth height H5 may be the longest. This is because the greater the distance the greater the amount of source materials reaching an opening H may be, since flow rates of supplied source materials varies according to the distances.

The rod layers 142A may be grown at a relatively lower temperature than capping layers 142B to be grown in a subsequent process. For example, the rod layers 142A may be grown at a temperature of 750° C. to 1050° C. When the process temperature is lower than the above described temperature, growth efficiency may be reduced. In addition, when the process temperature is higher than the above described temperature, it may be difficult to control the heights of the plurality of rod layers 142A such that the plurality of rod layers 142A are disposed within the mold layer 135 as intended in the example embodiments of the present inventive concepts. When the rod layers 142A are a nitride material including Ga, the amount of Ga source used in the process of growing the rod layers 142A may be greater than the amount of the Ga used in a process of growing the capping layers 142B.

The rod layers 142A may be, for example, formed of n-type nitride semiconductor. The rod layers 142A may be formed of the same material as the base layer 120. The rod layers 142A may be formed using metal organic chemical vapor deposition (MOCVD) or molecular beam epitaxy (MBE).

Figure 2D:
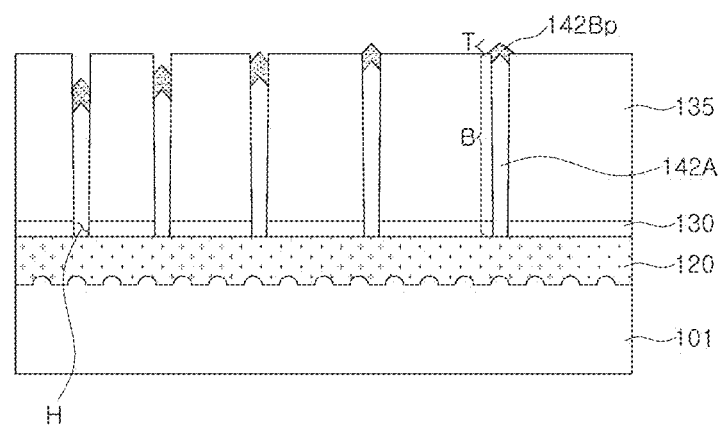

Referring to FIG. 2D, capping layers 142Bp may be formed on the rod layers 142A.

The capping layers 142Bp illustrated in FIG. 2D are in a state before the capping layers 142B illustrated in FIG. 1 are completely formed, and represented by a different reference numeral so as to be distinguished from the capping layers 142B. The capping layers 142Bp may be grown from the rod layers 142A onto the mold layer 135.

The capping layers 142Bp may be grown at a higher process temperature at a lower growth rate than the rod layers 142A. The capping layers 142Bp may be grown at a higher temperature than the rod layers 142A by about 70° C. to about 150° C. For example, the capping layers 142Bp may be grown at a temperature of 850° C. to 1150° C. In addition, when the capping layers 142Bp is a nitride including Ga, the amount of Ga source used in the growth process of the capping layers 142Bp may be smaller than that used in the growth process of the rod layers 142A. For example, the amount of Ga source used in the growth process of the capping layers 142Bp may be about half the amount of Ga source used in the growth process of the rod layers 142A.

The capping layers 142Bp may be grown under a condition in which once the capping layers 142Bp have a hexagonal pyramid shape with a predetermined and/or desired width on the mold layer 135, the capping layers 142Bp do not grow any more even if a growth time is increased. In such a manner, the growth may be self-limited or saturated since adsorption and desorption of the source materials of the capping layers 142Bp simultaneously occur. That is, when upper surfaces of the capping layers 142Bp in which the growth occurs have a predetermined and/or desired surface area, growth conditions, such as a growth temperature and/or the amount of source gases, may be controlled such that an adsorption rate and a desorption rate of the source materials are the same.

Figure 2E:
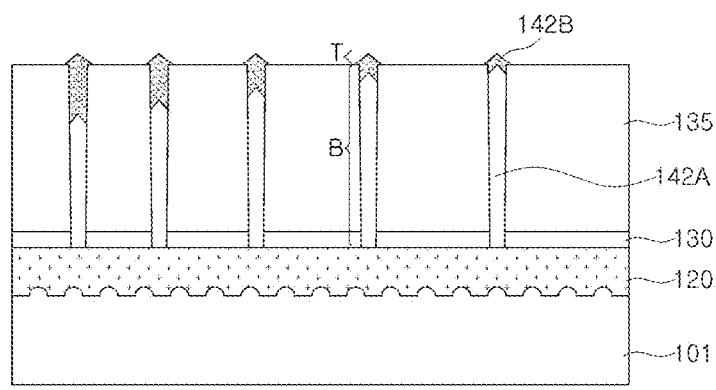

Referring to FIG. 2E, the growth process of the capping layers 142B may be completed.

The capping layers 142B may extend from the rod layers 142A onto the mold layer 135, side surfaces thereof may extend on an upper surface of the mold layer 135. Accordingly, widths of the capping layers 142B may be discontinuously changed on the mold layer 135. The capping layers 142B may be formed to have upper tips T having a pyramid shape such as hexagonal pyramid on the mold layer 135.

Since the upper tips T are formed not in the mold layer 135 but on the mold layer 135, source materials may be uniformly transmitted, and thus growth may proceed along a thermodynamically stable surface. Accordingly, centering of the upper tips T may be improved. That is, the vertex of the upper tips T of the rod layers 142A may be disposed adjacent to a central vertical axis of the bodies B.

As described with reference to FIG. 2D, when the upper surfaces of the capping layers 142B reach the predetermined and/or desired area, the growth may not proceed. Accordingly, even when the capping layers 142B are formed on the rod layers 142A having different heights, heights from the upper surface of the substrate 101 to the vertex of the capping layers 142B may be substantially the same. Accordingly, even when variations in sizes of the openings H occur in the process described above with reference to FIG. 2B or variations in heights of the rod layers 142A occur in the process described above with reference to FIG. 2C, the height to the capping layers 142B may be controlled to be uniform. Thus, the light-emitting nanostructures 140 (refer to FIG. 1) having uniform sizes may be formed through a subsequent process.

Figure 2F:
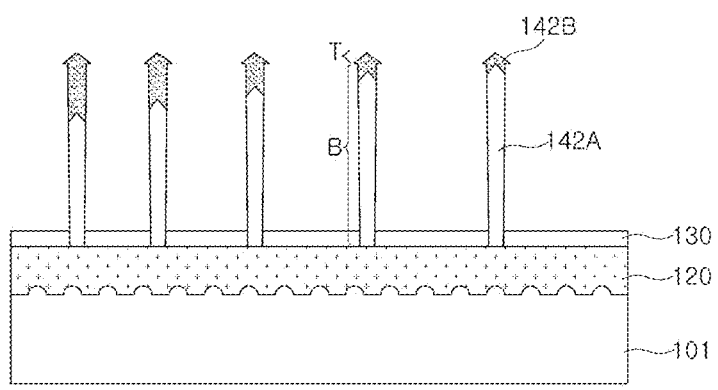

Referring to FIG. 2F, the mold layer 135 may be removed to expose the rod layers 142A and the capping layers 142B.

First, the mold layer 135 may be selectively removed with respect to the mask layer 130, the rod layers 142A, and the capping layers 142B. Thus, the mask layer 130 may remain. The removal process may be, for example, executed using a wet etching process. The mask layer 130 may function to prevent active layers 144 and second conductivity type semiconductor layers 146 formed in a subsequent process from contacting the base layer 120.

The rod layers 142A and the capping layers 142B may have a predetermined and/or desired inclination with respect to the upper surface of the substrate 101.

Figure 2G:
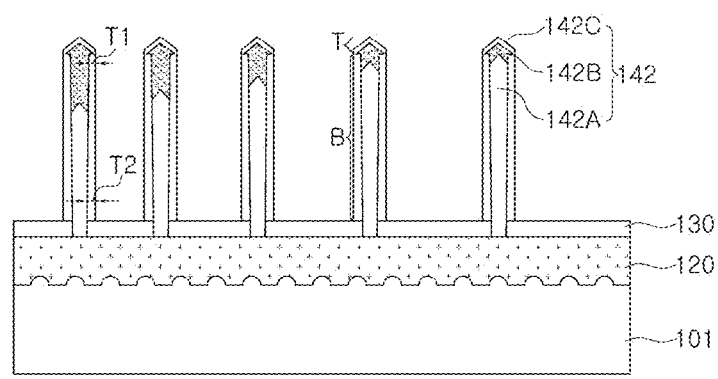

Referring to FIG. 2G, cover layers 142C may be formed on exposed surfaces of the rod layers 142A and the capping layers 142B. Thereby, the first conductivity-type semiconductor cores 142 including the rod layers 142A, the capping layers 142B, and the cover layers 142C may be formed. In some example embodiments, the formation of the cover layers 142C may be omitted.

Process conditions for forming the cover layers 142C may be controlled such that the growth of bodies B is preferentially performed in order to form the bodies B having a hexagonal prism shape. The formation of the cover layers 142C may be performed, for example, in a $H_2$ atmosphere. For example, trimethyl gallium (TMGa) decomposed well in the $H_2$ atmosphere may be used as a gallium precursor. In the $H_2$ atmosphere, since r-planes of the upper tips T are passivated by $H_2$, the growth of bodies B may be derived more than the growth of the upper tips T.

The cover layers 142C may be formed to be thicker in the bodies B than in the upper tips T. The cover layers 142C may have a first thickness T1 at an upper portion and a second thickness T2 greater than the first thickness T1 in a lower portion in the bodies B.

Since the growth of the bodies B is preferentially performed during the formation of the cover layers 142C, if the heights of the plurality of the rod layers 142A and capping layers 142B and the surface area of the upper surfaces of the capping layers 142B are uniform, the uniformity of the sizes of the first conductivity-type semiconductor cores 142 may be maintained even after the cover layers 142C is formed.

Figure 2H:
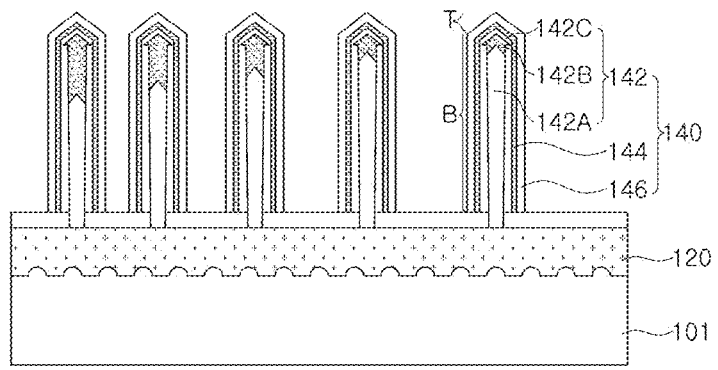

Referring to FIG. 2H, the active layers 144 and the second conductivity type semiconductor layers 146 may be formed on the first conductivity-type semiconductor cores 142.

In this process, core-shell structured light-emitting nanostructures 140 may be formed. Depending on the deposition method, the active layers 144 and the second conductivity type semiconductor layers 146 may have different thicknesses on m-planes and r-planes of the first conductivity-type semiconductor cores 142. For example, the active layers 144 and the second conductivity type semiconductor layers 146 may have a greater thickness in the bodies B than in the upper tips T.

In some example embodiments, a charge-blocking layer may further be formed on the active layers 144. In addition, in some example embodiments, not the active layers 144 but the charge-blocking layer may be disposed on inclined surfaces of in the upper tips T of the second conductivity-type semiconductor cores 142. The charge-blocking layer may function to prevent charged injected from the first conductivity-type semiconductor cores 142 from moving to the second conductivity type semiconductor layers 146 without being used to electron-hole recombination in the active layers 144. The charge-blocking layer may include a material having greater bandgap energy than the active layers 144, for example, aluminum gallium nitride (AlGaN) or aluminum indium gallium nitride (AlInGaN).

In some example embodiments, a stress-relief layer may further be formed below the active layers 144. The stress-relief layer may have, for example, a super-lattice structure, and prevent stress generation in the active layers 144 disposed thereon.

Figure 2I:
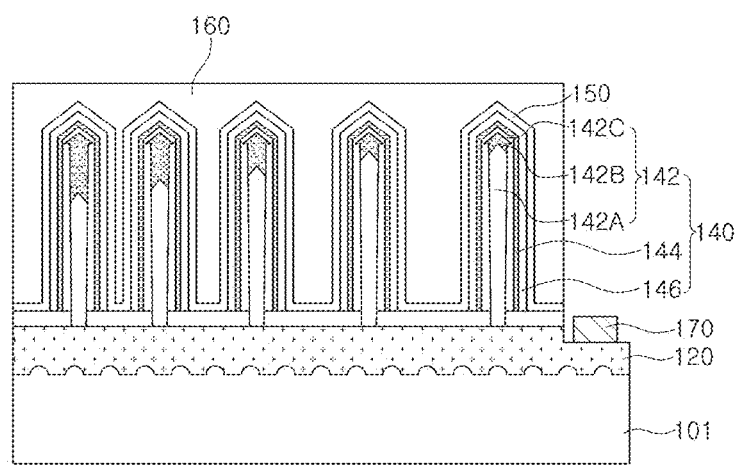

Referring to FIG. 2I, a transparent electrode layer 150 and a filling layer 160 may be formed on the second conductivity type semiconductor layers 146.

The transparent electrode layer 150 may extend to cover an upper surface of the mask layer 130 between the adjacent light-emitting nanostructures 140, and be formed in a single layer on the plurality of light-emitting nanostructures 140.

In some example embodiments, the filling layer 160 may be formed of a plurality of layers, and the plurality of layers may be formed of different materials or by different deposition processes even when the plurality of layers include the same material.

Next, referring again to FIG. 1, the base layer 120 may be partially exposed to form a first electrode 170, and a second electrode 180 may be formed on the transparent electrode layer 150.

In some example embodiments, a reflective electrode layer instead of the transparent electrode layer 150 may be formed, and the reflective electrode layer may include Ag or Al. In some example embodiments, the semiconductor light-emitting device may be flip-chip mounted on an external apparatus such as a package substrate.

Figure 3:
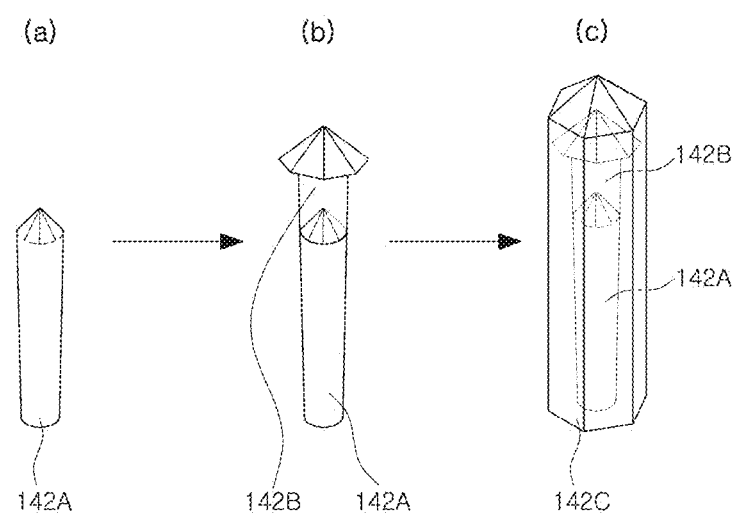
FIG. 3 is a schematic diagram illustrating a process of forming a first conductivity-type semiconductor core by using a method of manufacturing a semiconductor light-emitting device according to an example embodiment of the present inventive concepts.

FIG. 3 is a schematic diagram illustrating a process of forming a first conductivity-type semiconductor core by using a method of manufacturing a semiconductor light-emitting device according to an example embodiment of the present inventive concepts.

Referring to FIG. 3, a structure in which the rod layer 142A, the capping layer 142B, and the cover layer 142C of the first conductivity-type semiconductor core 142 described with reference to FIGS. 1 to 2I are sequentially illustrated.

When the openings H of the mold layer 135 in FIG. 2B have a cylindrical shape, the rod layer 142A may have a body B having a cylindrical shape or a smoothed hexagonal prism shape and an upper tip T having a cone shape or a smoothed hexagonal pyramid shape, as illustrated in (a). For example, the shape of the body B of the rod layer 142A may follow the shape of the opening H, and the upper tip T of the rod layer 142A may be freely formed in a space of the opening H and grown along a crystallographically stable surface to have the hexagonal pyramid shape. In some example embodiments, the rod layer 142A may have the body B having the cylindrical shape and the upper tip T having a smoothed hexagonal pyramid shape.

The capping layer 142B may be formed such that the upper tip T thereof has a hexagonal pyramid shape, as illustrated in (b). The capping layer 142B may be grown at a relatively low growth rate, have improved crystallinity than the rod layer 142A, and have a thermodynamically and crystallographically stable shape. Accordingly, the upper tip T thereof may more clearly have a hexagonal pyramid shape.

The cover layer 142C may be formed such that the body B has a hexagonal prism shape, as illustrated in (c). The cover layer 142C may be grown from both of the upper tips T and the bodies B, however, mainly grown from the body B to have a thermodynamically and crystallographically stable shape FIG. 4 is a plan view schematically illustrating a semiconductor wafer on which semiconductor light-emitting devices according to an example embodiment of the present inventive concepts are formed.

Figure 4:
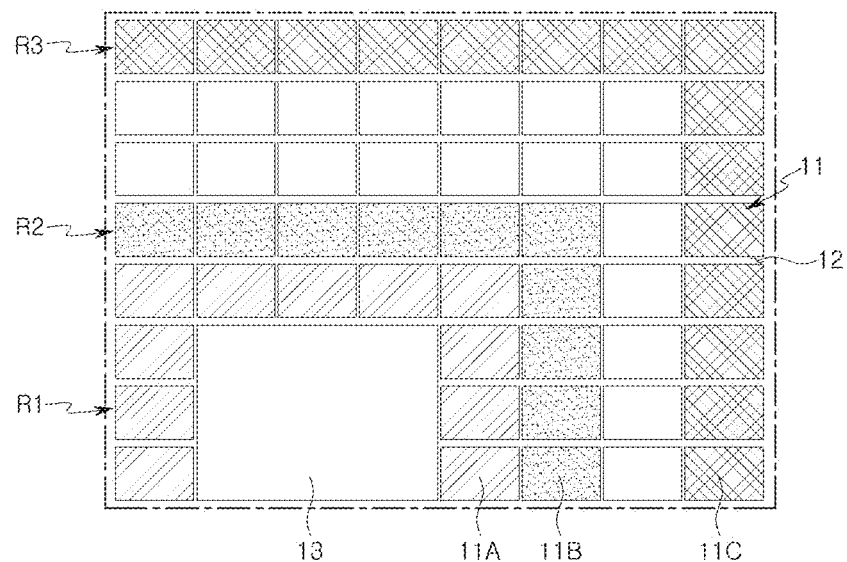
FIG. 4 is a plan view schematically illustrating a semiconductor wafer on which semiconductor light-emitting devices according to an example embodiment of the present inventive concepts are formed.

Referring to FIG. 4, the semiconductor wafer 10 may include a plurality of light-emitting chips 11, a key region 13, and scribe lane regions 12 between the light-emitting chips 11.

The light-emitting chips 11 may be regions in which the semiconductor light-emitting devices 100 described with reference to FIG. 1 are disposed. The plurality of light-emitting chips 11 may be formed on a single semiconductor wafer 10.

The scribe lane regions 12 may be disposed to surround each of the light-emitting chips 11. The scribe lane regions 12 may correspond to regions for dicing the semiconductor wafer 10 into the plurality of light-emitting chips 11 after forming the semiconductor light-emitting devices in the light-emitting chips 11.

In the key region 13, alignment keys or overlay keys used in processes of forming the semiconductor light-emitting device in the light-emitting chips 11, such as exposure processes, may be disposed. A location and a size of the key region 13 are not limited to those illustrated in FIG. 4.

The light-emitting chips 11 may be disposed in regions having different surrounding conditions from each other in the semiconductor wafer 10. For example, portions of the light-emitting chips 11 may be disposed first to third regions R1, R2, and R3 of the semiconductor wafer 10. The first region R1 may be a peripheral region of the key region 13, the second region R2 may be a region adjacent to the first region R1, and the third region R3 may be a region spaced apart from the key region 13.

The semiconductor light-emitting devices in the plurality of light-emitting chips 11 may include the plurality of light-emitting nanostructures 140 as illustrated in FIG. 1. However, since the semiconductor light-emitting devices are not formed in the key region 13, the light-emitting nanostructures 140 may not be formed therein, too. Accordingly, while the semiconductor light-emitting devices are fabricated, light-emitting nanostructures 140 of light-emitting chips 11A, 11B, and 11C disposed in the first to third regions R1, R2, and R3 having may be grown in different surrounding conditions from each other. For example, a flow rate or a stream of the source material may be different due to differences in density of the light-emitting nanostructures 140 disposed therearound. For example, the light-emitting nanostructures 140 in the light-emitting chips 11A disposed in the first region R1 may have a relatively higher rod layers 142A (refer to FIG. 1). In addition, the light-emitting nanostructures 140 in the light-emitting chips 11C disposed in the third region R3 may have a relatively lower rod layers 142A. Accordingly, the light-emitting nanostructures 140 of the light-emitting chips 11A, 11B, and 11C disposed in the first to third regions R1, R2, and R3 may be grown to have different shapes and sizes.

However, according to the example embodiment of the present inventive concepts, even when the heights of the rod layers 142A are different, the first conductivity-type semiconductor cores 142 (refer to FIG. 1) may have substantially the same height by the capping layers 142B. Accordingly, variation in heights of the light-emitting nanostructures 140 due to the differences in regions in the semiconductor wafer 10 may hardly occur, and thus variations in characteristics of the light-emitting chips 11 due to the differences in regions may not occur.

Figure 5A:
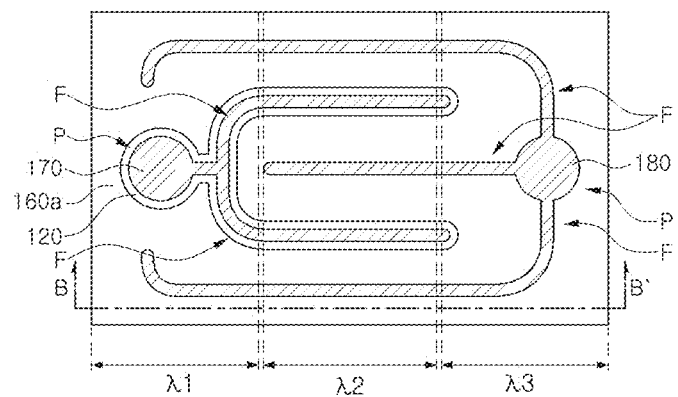
FIGS. 5A and 5B are a plan view and a cross-sectional view, schematically illustrating a semiconductor light-emitting device according to an example embodiment of the present inventive concepts.
Figure 5B:
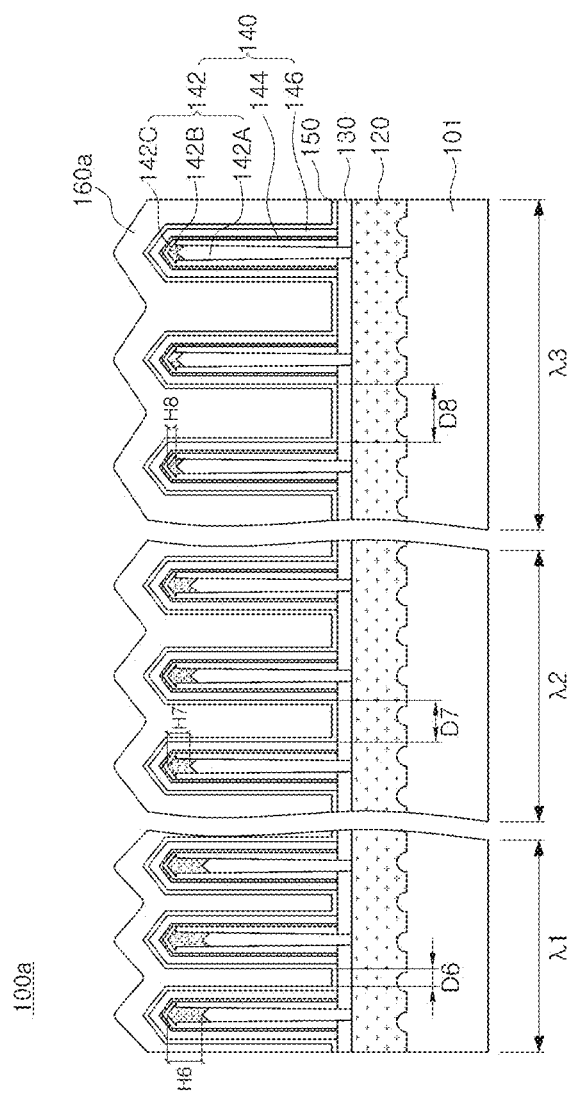

FIGS. 5A and 5B are a plan view and a cross-sectional view, schematically illustrating a semiconductor light-emitting device according to an example embodiment of the present inventive concepts. FIG. 5B illustrates an arrangement of light-emitting nanostructures 140 in a cross-section taken along line B-B' of FIG. 5A, and the number of the light-emitting nanostructures 140 may be arbitrarily chosen.

Referring to FIGS. 5A and 5B, a semiconductor light-emitting device 100a may include a substrate 101, a first conductivity-type semiconductor base layer 120 formed on the substrate 101, an insulating layer 130, light-emitting nanostructures 140, transparent electrode layer 150, and a filling layer 160a. The light-emitting nanostructures 140 may include first conductivity-type semiconductor cores 142, active layers 144, and second conductivity type semiconductor layers 146, grown from the first conductivity-type semiconductor base layer 120. The semiconductor light-emitting device 100a may include first and second electrodes 170 and 180 electrically connected to the base layer 120 and the second conductivity type semiconductor layers 146.

As illustrated in FIG. 5A, each of the first and second electrodes 170 and 180 may include a pad P and fingers F extending from the pad P and having a smaller width than the pad P, so that currents are uniformly distributed throughout the plurality of light-emitting nanostructures 140. The pad P may be a portion to contact a conductive wire or a solder bump. In addition, fingers F of the first electrode 170 and fingers F of the second electrode 180 may be alternately and staggeredly arranged. Due to such an arrangement of the first and second electrodes 170 and 180, currents may efficiently flow in the light-emitting nanostructures 140, and thus light emission efficiency may be improved. According to embodiments, a relative arrangement of the pad P and the fingers F, and the number of the fingers F may change.

As illustrated in FIG. 5B, the first conductivity-type semiconductor cores 142 may include rod layers 142A, capping layers 142B, and cover layers 142C. In addition, the filling layer 160a may have a curved upper surface along the light-emitting nanostructures 140.

The semiconductor light-emitting device 100a according to the example embodiment of the present inventive concepts may include first to third light-emitting regions λ1, λ2, and λ3 emitting light having different wavelengths. In each of the first to third light-emitting regions λ1, λ2, and λ3, distances between the light-emitting nanostructures 140 may be different, that is, sixth to eighth lengths D6, D7, and D8. Here, the sixth length D6 may be the smallest and the eighth length D8 may be the greatest.

Since the distances between the light-emitting nanostructures 140 are different in the first to third light-emitting regions λ1, λ2, and λ3, heights of the rod layers 142A and the capping layers 142B may be different. For example, the height of the rod layers 142A may be the smallest in the first light-emitting region λ1 having the smallest distance between the light-emitting nanostructures 140, and the greatest in the third light-emitting region λ3 having the smallest distance between the light-emitting nanostructures 140. In addition, the capping layers 142B may have different heights H6, H7, and H8, and the height H6 of the capping layers 142B may be the greatest in the first light-emitting region λ1, and the height H8 of the capping layers 142B may be the smallest in the third light-emitting region λ3. In addition, the heights of the rod layers 142A and the heights of the capping layers 142B may be different even in one light-emitting regions λ1, λ2, and λ3 depending on locations. For example, the heights of the rod layers 142A and the heights of capping layers 142B may be different in the light-emitting nanostructures 140 disposed adjacent to other light-emitting regions λ1, λ2, and λ3 from in the light-emitting nanostructures 140 disposed at a center portion of the light-emitting regions λ1, λ2, and λ3. However, the heights of the first conductivity-type semiconductor cores 142 and the light-emitting nanostructures 140 may be uniform in the semiconductor light-emitting device 100a.

In the example embodiments of the present inventive concepts, when the semiconductor light-emitting device 100a includes first to third light-emitting regions λ1, λ2, and λ3 having different distances between the light-emitting nanostructures 140, contents of In or growth thicknesses of the active layers 144 of the light-emitting nanostructures 140 grown in different light-emitting regions λ1, λ2, and λ3 may be different. For example, when the growth conditions are the same, the greater the distances between the light-emitting nanostructures 140, the greater the content of In and the growth thickness of the active layers 144. Accordingly, the light-emitting nanostructures 140 in the first to third light-emitting regions λ1, λ2, and λ3 may emit light having different wavelengths, and may emit white light, that is, mixed light thereof. In some example embodiments, in the first to third light-emitting regions λ1, λ2, and λ3, the widths of the light-emitting nanostructures 140 may be different.

FIGS. 6A to 7B illustrate electron microscopic images of first conductivity-type semiconductor cores of a semiconductor light-emitting device according to a comparative example and an example embodiment of the present inventive concepts. FIGS. 6A to 7B illustrate results of analysis of the first conductivity-type semiconductor cores 142 (refer to FIG. 1) using scanning electron microscopy (SEM).

Figure 6A:
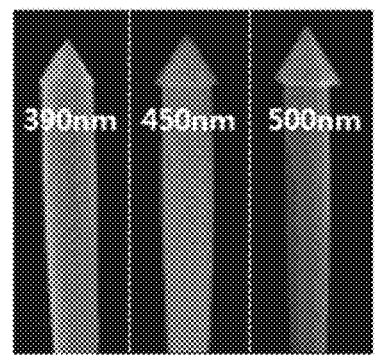
FIGS. 6A to 7B illustrate electron microscopic images of first conductivity-type semiconductor cores of a semiconductor light-emitting device according to a comparative example and an example embodiment of the present inventive concepts.
Figure 6B:
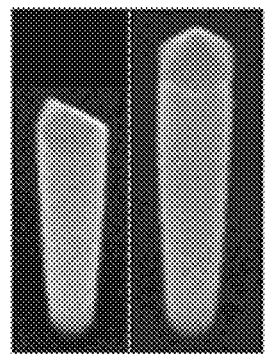

FIGS. 6A and 6B illustrate first conductivity-type semiconductor cores 142 according to a comparative example. FIG. 6A illustrates first conductivity-type semiconductor cores 142 in different semiconductor wafers 10 (refer to FIG. 4), and FIG. 6B illustrates first conductivity-type semiconductor cores 142 in a single semiconductor wafer 10. In the comparative example, rod layers 142A were formed on a mold layer 135 without forming capping layers 142B in the process described with reference to FIG. 2C, and then cover layers 142C were formed.

Figure 7A:
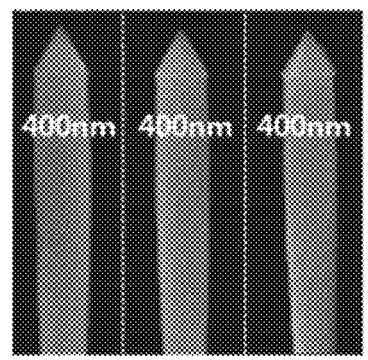
Figure 7B:
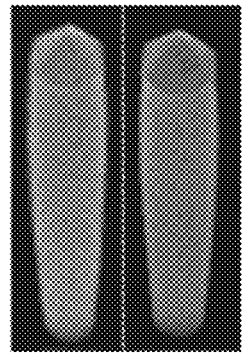

FIGS. 7A and 7B illustrate first conductivity-type semiconductor cores 142 according to an example embodiment of the present inventive concepts. FIG. 7A illustrates first conductivity-type semiconductor cores 142 in different semiconductor wafers 10, and FIG. 7B illustrates first conductivity-type semiconductor cores 142 in a single semiconductor wafer 10.

Referring to FIG. 6A to 7B, in the comparative example, variations in heights and widths occurred in the different semiconductor wafers 10, and the variation in heights significantly occurred even in a single semiconductor wafer 10. However, in the example embodiments of the present inventive concepts, variations in heights did not occur in the different semiconductor wafers 10 and in a single semiconductor wafer 10. Accordingly, variations in widths did not substantially occur.

More specifically, when an average width of the first conductivity-type semiconductor cores 142 is in the range of about 420 nm to 480 nm, the standard deviation of widths of the first conductivity-type semiconductor cores 142 in the different semiconductor wafers 10 was about 33 nm in the comparative example and about 4 nm in the example embodiments of the present inventive concepts. In addition, in the case in which a single light-emitting chip 11 (refer to FIG. 4) includes different light-emitting regions as illustrated in FIGS. 5A and 5B, the standard deviation of widths of the first conductivity-type semiconductor cores 142 in the single semiconductor wafer 10 was about 14 nm in the comparative example, and about 8 nm in the example embodiments of the present inventive concepts.

This is because, in the example embodiment of the present invention, the heights of the first conductivity-type semiconductor cores 142 may be controlled to be uniform by forming the capping layers 142B on the rod layers 142A, and thus sizes of the entire first conductivity-type semiconductor cores 142 may be controlled to be uniform.

Figure 8:
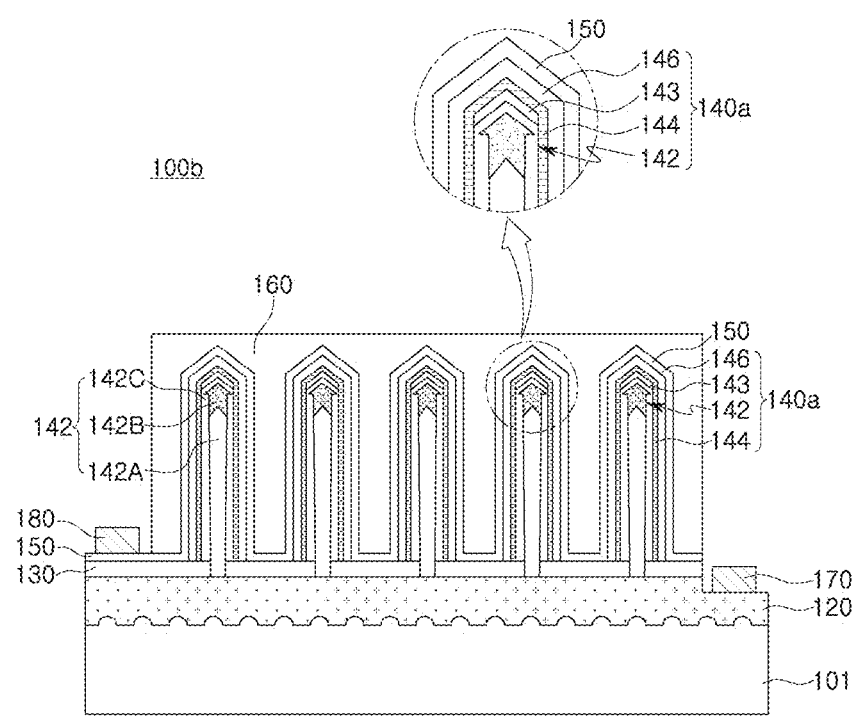
FIG. 8 is a cross-sectional view schematically illustrating a semiconductor light-emitting device according to an example embodiment of the present inventive concepts.

FIG. 8 is a cross-sectional view schematically illustrating a semiconductor light-emitting device according to an example embodiment of the present inventive concepts.

Referring to FIG. 8, a semiconductor light-emitting device 100b may include a substrate 101, a base layer 120 formed on the substrate 101, a mask layer 130, a light-emitting nanostructures 140a, a transparent electrode layer 150, and a filling layer 160. The light-emitting nanostructures 140a may include first conductivity-type semiconductor cores 142, high-resistance layers 143, active layers 144, and second conductivity type semiconductor layers 146, grown from the base layer 120. The first conductivity-type semiconductor cores 142 may include rod layers 142A, capping layers 142B, and cover layers 142C. The semiconductor light-emitting device 100b may further include first and second electrodes 170 and 180 electrically connected to the base layer 120 and the second conductivity type semiconductor layers 146.

In the example embodiment of the present inventive concepts, the high-resistance layers 143 may further be disposed on inclined surfaces of upper tips of the first conductivity-type semiconductor cores 142. However, in some example embodiments, the high-resistance layers 143 may be disposed on surfaces of the active layers 144.

The high-resistance layers 143 may be formed of a material having high electrical resistivity in order to prevent leakage current from being generated in the upper tips of the first conductivity-type semiconductor cores 142. For example, the high-resistance layers 143 may be formed of a semiconductor material undoped or doped with impurities having a conductivity opposite to a conductivity of the first conductivity-type semiconductor cores 142. For example, when the first conductivity-type semiconductor cores 142 are n-type gallium nitride (n-GaN), the high-resistance layers 143 may be undoped GaN, or GaN doped with p-type impurities, such as Mg. However, composition of the high-resistance layers 143 may be different according to embodiments. The high-resistance layers 143 may be formed of aluminum indium gallium nitride having a composition of $Al_xIn_yGa_{1-x-y}N$ ($0 \leq x < 1$, $0 \leq y < 1$, and $0 \leq x+y < 1$) by growing GaN first conductivity-type semiconductor cores 142, and additionally supplying at least one source of Al and In in-situ.

In the semiconductor light-emitting device 100b according to the example embodiment of the present inventive concepts, leakage currents may be effectively blocked on the light-emitting nanostructures 140a by forming the high-resistance layers 143.

Figure 9:
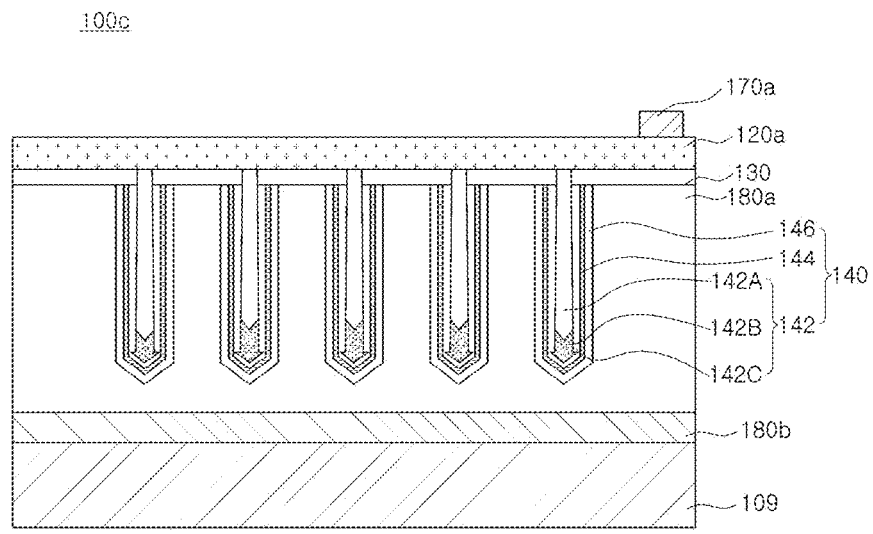
FIG. 9 is a cross-sectional view schematically illustrating a semiconductor light-emitting device according to an example embodiment of the present inventive concepts.

FIG. 9 is a cross-sectional view schematically illustrating a semiconductor light-emitting device according to an example embodiment of the present inventive concepts.

Referring to FIG. 9, a semiconductor light-emitting device 100c may include a conductive substrate 109, a first conductivity-type semiconductor base layer 120a, a mask layer 130, and light-emitting nanostructures 140. The light-emitting nanostructures 140 may include first conductivity-type semiconductor cores 142, active layers 144, and second conductivity type semiconductor layers 146, grown from the first conductivity-type semiconductor base layer 120a. The first conductivity-type semiconductor cores 142 may include rod layers 142A, capping layers 142B, and cover layers 142C. The semiconductor light-emitting device 100c may further include a first electrode 170a and second electrodes 180a and 180b electrically connected to the first conductivity-type semiconductor base layer 120a and the second conductivity type semiconductor layers 146.

The conductive substrate 109 may be formed of a conductive material. For example, the conductive substrate 109 may be a Si substrate or a Si—Al alloy substrate.

The second electrodes 180a and 180b may include a contact electrode layer 180a and a bonding electrode layer 180b, and the conductive substrate 109 may be electrically connected to the contact electrode layer 180a by the bonding electrode layer 180b. In some example embodiments, as illustrated in FIG. 1, a transparent electrode layer 150 covering the light-emitting nanostructures 140 may further be disposed.

The contact electrode layer 180a may include a material appropriate for forming an ohmic contact with the second conductivity type semiconductor layers 146 of the light-emitting nanostructures 140. The contact electrode layer 180a may be, for example, formed of GaN, InGaN, ZnO, or a graphene layer. In addition, the contact electrode layer 180a may include Ag, Ni, Al, Rh, Pd, Ir, Ru, Mg, Zn, Pt, Au, or the like, and may have a structure of two or more layers of such materials, such as Ni/Ag, Zn/Ag, Ni/Al, Zn/Al, Pd/Ag, Pd/Al, Ir/Ag, Ir/Au, Pt/Ag, Pt/Al, or Ni/Ag/Pt. For example, the contact electrode layer 180a may be formed of a reflective metal layer in consideration of light extraction efficiency. In some example embodiments, light emitted from the active layers 144 toward the conductive substrate 109 may be upwardly reflected. The bonding electrode layer 180b may be a eutectic metal layer such as Ni/Sn.

The semiconductor light-emitting device 100c according to the example embodiment of the present inventive concepts may be fabricated by forming the contact electrode layer 180a instead of the filling layer 160 in the process described with reference to FIG. 2I and forming the bonding electrode layer 180b on the contact electrode layer 180a. Next, the conductive substrate 109 may be bonded to the contact electrode layer 180a, and the semiconductor growth layer, that is, the substrate 101 (refer to FIG. 1) disposed on the first conductivity-type semiconductor base layer 120a may be removed. Unlike the semiconductor light-emitting device 100 illustrated in FIG. 1, the first conductivity-type semiconductor base layer 120a according to the example embodiment of the present inventive concepts may not include uneven structure, but is not limited thereto.

Figure 10:
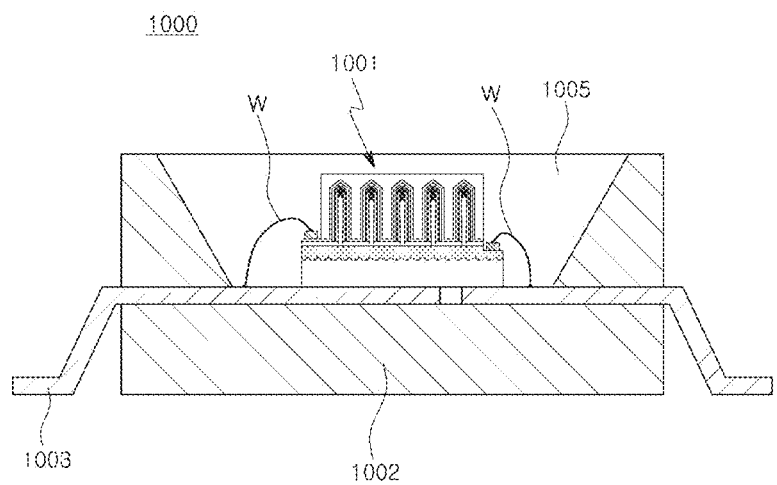
FIGS. 10 and 11 illustrate examples in which a semiconductor light-emitting device according to an example embodiment of the present inventive concepts is applied to a package.
Figure 11:
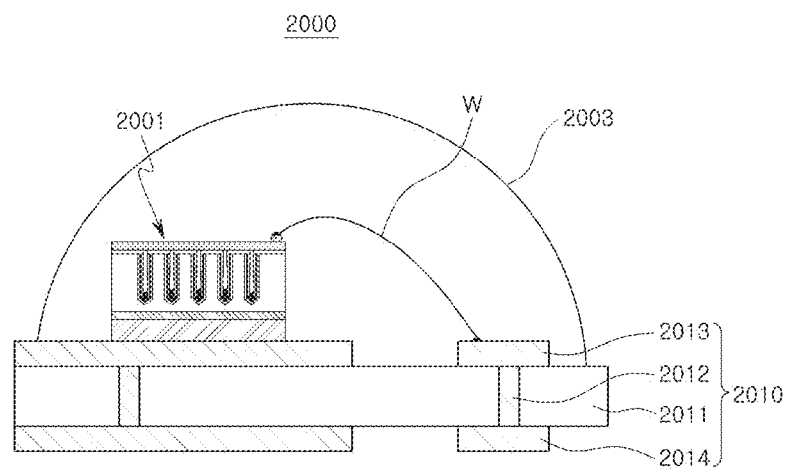

FIGS. 10 and 11 illustrate examples in which a semiconductor light-emitting device according to an example embodiment of the present inventive concepts is applied to a package.

Referring to FIG. 10, a semiconductor light-emitting device package 1000 may include a semiconductor light-emitting device 1001, a package body 1002, and a pair of lead-frames 1003. The semiconductor light-emitting device 1001 may be mounted on the lead-frames 1003 and electrically connected to the lead-frames 1003 through a wire W. In some example embodiments, the semiconductor light-emitting device 1001 may be mounted on a portion other than the lead-frames 1003, for example, the package body 1002. In addition, package body 1002 may have a cup (U) shape in order to improve reflective efficiency of light, and an encapsulating material 1005 formed of a light-transmissive material may be formed in the reflective cup-shaped package body 1002 to encapsulate the semiconductor light-emitting device 1001 and the wire W.

In the example embodiment of the present inventive concepts, the semiconductor light-emitting device package 1000 is illustrated as including a semiconductor light-emitting device 1001 having the same structure as the semiconductor light-emitting device 100 illustrated in FIG. 1. However, in some example embodiments, the semiconductor light-emitting device package 1000 may include the semiconductor light-emitting device 100a, 100b, or 100c in other example embodiments described with reference to FIGS. 5A, 5B, 8, and 9.

Referring to FIG. 11, a semiconductor light-emitting device package 2000 may include a semiconductor light-emitting device 2001, a mounting board 2010, and an encapsulating material 2003. The semiconductor light-emitting device 2001 may be mounted on the mounting board 2010 to be electrically connected to the mounting board 2010 through a wire W and the conductive substrate 109 (refer to FIG. 9).

The mounting board 2010 may include a board body 2011, an upper surface electrode 2013, and a lower surface electrode 2014. In addition, the mounting board 2010 may further include a through via 2012 connecting the upper surface electrode 2013 to the lower surface electrode 2014. The mounting board 2010 may be provided as a substrate, such as a PCB, an MCPCB, an MPCB, and an FPCB. The structure of the mounting board 2010 may be embodied in various forms.

The encapsulating material 2003 may have a dome-shaped lens structure having a convex upper surface. However, in some example embodiments, the encapsulating material 2003 may have a convex or concave lens structure to adjust an orientation angle of light emitted through the upper surface of the encapsulating material 2003.

In the example embodiment of the present inventive concepts, the semiconductor light-emitting device package 2000 is illustrated as including a semiconductor light-emitting device 2001 having the same structure as the semiconductor light-emitting device 100c illustrated in FIG. 9. However, in some example embodiments, the semiconductor light-emitting device package 2000 may include the semiconductor light-emitting device 100, 100a, or 100b in other example embodiments described with reference to FIGS. 1, 5A, 5B, and 8.

Figure 12:
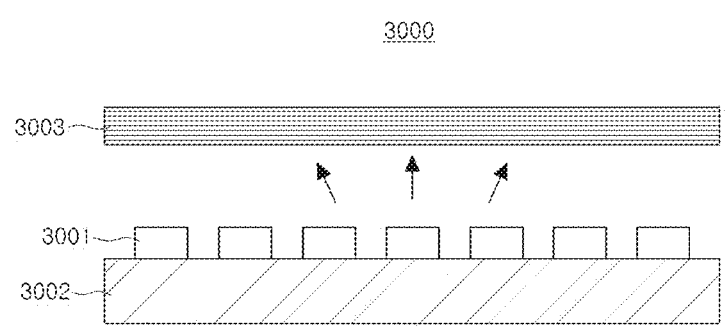
FIGS. 12 and 13 illustrate examples in which a semiconductor light-emitting device according to an example embodiment of the present inventive concepts is applied to a backlight unit.
Figure 13:
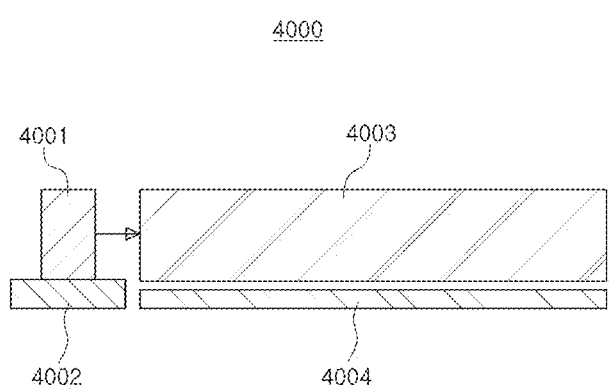

FIGS. 12 and 13 illustrate examples in which a semiconductor light-emitting device according to an example embodiment of the present inventive concepts is applied to a backlight unit.

Referring to FIG. 12, a backlight unit 3000 may include a light source 3001 mounted on a substrate 3002, and one or more optical sheets 3003 disposed on the light source 3001. The light source 3001 may include a semiconductor light-emitting device package having the structure described with reference to FIGS. 10 and 11 or a structure similar thereto. In addition, a semiconductor light-emitting device may be directly mounted on the substrate 3002 (so called, a COB type).

The light source 3001 in the backlight unit 3000 illustrated in FIG. 12 emits light toward a top surface where a liquid crystal display (LCD) is disposed. On the contrary, in another backlight unit 4000 illustrated in FIG. 13, a light source 4001 mounted on a substrate 4002 emits light in a lateral direction, and the emitted light may be incident to a light guide plate 4003 and converted to the form of surface light. Light passing through the light guide plate 4003 is emitted upwardly, and a reflective layer 4004 may be disposed on a bottom surface of the light guide plate 4003 to improve light extraction efficiency.

Figure 14:
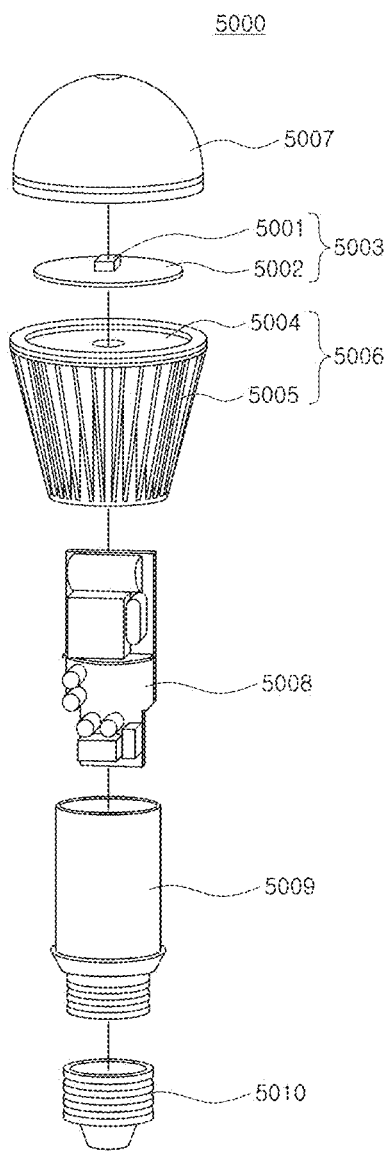
FIG. 14 illustrates an example in which a semiconductor light-emitting device according to an example embodiment of the present inventive concepts is applied to an illumination apparatus.

FIG. 14 illustrates an example in which a semiconductor light-emitting device according to an example embodiment of the present inventive concepts is applied to an illumination apparatus.

Referring to an exploded perspective view of FIG. 14, the illumination apparatus 5000 is illustrated as a bulb-type lamp as an example, and includes a light-emitting module 5003, a driving unit 5008, and an external connection portion 5010. In addition, external structures, such as external and internal housings 5006 and 5009 and a cover 5007, may be further included. The light-emitting module 5003 may include a semiconductor light-emitting device 5001 having the same structure as the semiconductor light-emitting devices 100, 100a, 100b, and 100c, described with reference to FIGS. 1, 5A, 5B, 8, and 9, or a structure similar thereto, and a circuit board 5002 with the semiconductor light-emitting device 5001 mounted thereon. In the example embodiment of the present inventive concepts, a single semiconductor light-emitting device 5001 is mounted on the circuit board 5002, but a plurality of semiconductor light-emitting devices 5001 may be mounted as needed. In addition, the semiconductor light-emitting device 5001 may be not directly mounted on the circuit board 5002, but mounted after being fabricated in a package type.

The external housing 5006 may function as a heat dissipation unit, and include a heat dissipation plate 5004 in direct contact with the light-emitting module 5003 to enhance a heat dissipation effect, and a heat radiation fin 5005 surrounding side surfaces of the illumination apparatus 5000. The cover 5007 may be installed on the light-emitting module 5003, and have a convex lens shape. The driving unit 5008 may be installed in the internal housing 5009 and connected to the external connection portion 3010, such as a socket structure, to receive power from an external power source. In addition, the driving unit 5008 may function to convert the power to an appropriate current source capable of driving the light source 5001 of the light-emitting module 5003. For example, the driving unit 5008 may be configured as an AC-DC converter, a rectifying circuit component, or the like.

In addition, although not illustrated in the drawings, the illumination apparatus 5000 may further include a communications module.

Figure 15:
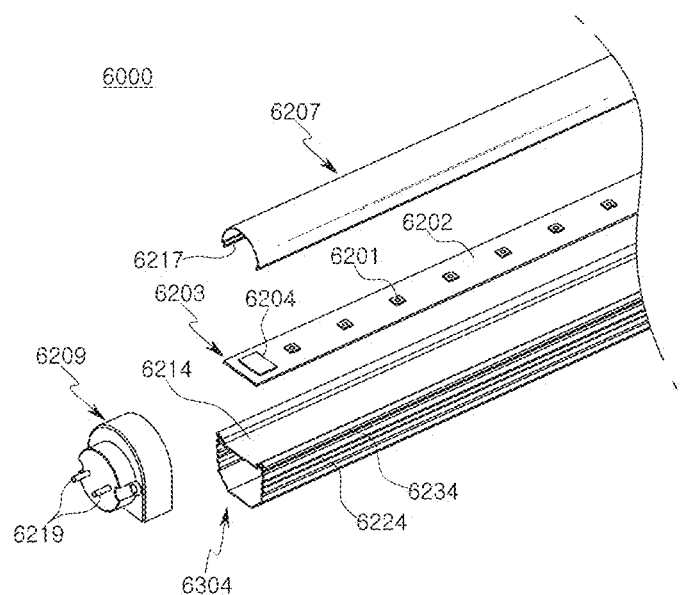
FIG. 15 illustrates an example in which a semiconductor light-emitting device according to an example embodiment of the present inventive concepts is applied to an illumination apparatus.

FIG. 15 illustrates an example in which a semiconductor light-emitting device according to an example embodiment of the present inventive concepts is applied to an illumination apparatus.

Referring to an explosive perspective view of FIG. 15, an illumination apparatus 6000 according to an example embodiment of the present inventive concepts may include a light-emitting module 6203, a body 6304, and a driving unit 6209. In addition, the illumination apparatus 6000 according to the example embodiment of the present inventive concepts may further include a cover 6207 covering the light source unit 6203. The illumination apparatus 6000 may be a bar-type lamp. The illumination apparatus 6000 may have a similar shape to a fluorescent light and emit light having similar optical characteristics to the fluorescent light, but is not limited thereto.

The light-emitting module 6203 may include a mounting board 6202, and a plurality of light-emitting devices 6201 mounted on the mounting board 6202. The plurality of light-emitting devices 6201 may have the same structure as the semiconductor light-emitting devices 100, 100a, 100b, and 100c, described with reference to FIGS. 1, 5A, 5B, 8, and 9, or a structure similar thereto. The light-emitting devices 6201 may be attached on the mounting board 6202 via an adhesive material, and the adhesive material may have a scattering pattern.

The light-emitting module 6203 fixedly mounted on a surface of the body 6304. The body 6304 may be a kind of a supporting structure and include a heat sink. The body 6304 may be formed of a material having a high thermal conductivity, for example, a metal material, in order to release heat generated in the light-emitting module 6203 to the outside, but is not limited thereto. The body 6304 may have an elongated rod shape as a whole, corresponding to a shape of the mounting board 6202 of the light-emitting module 6203. A recess 6214 capable of accommodating the light-emitting module 6203 may be formed on the surface on which the light-emitting module 6203 is mounted. A plurality of heat dissipating fins 6224 for heat dissipation may be formed to protrude on at least one outer side surface of the body 6304. In addition, fastening grooves 6234 extending in a longitudinal direction of the body 6304 may be formed on the outer side surfaces of the body 6304, at both ends of the recess 6214. The cover 6207 may be fastened to the fastening grooves 6234. At least one end of the body 6304 in a longitudinal direction may be open such that the body 6304 has a pipe structure in which at least one end thereof is open.

The driving unit 6209 may be disposed on the open end of the body 6304 in the longitudinal direction, and supply driving power to the light-emitting module 6203. The driving unit 6209 may include an electrode pin 2019 protruding outside.

The cover 6207 may be fastened to the body 6304 to cover the light-emitting module 6203. The cover 6207 may be formed of a light-transmissive material. The cover 6207 may have a semi-circularly curved surface so that light is uniformly emitted to the outside. In addition, an overhanging 6217 engaged with the fastening groove 6234 of the body 6304 may be formed at a bottom of the cover 6207 combined with the body 6304 in a longitudinal direction of the cover 6207.

In the example embodiment, the cover 2007 is illustrated as having a semi-circularly curved surface, but is not limited thereto. The shape of the cover 6207 may be variously modified depending on a design of the illumination apparatus emitting light. For example, the cover 6207 may have a flat rectangular shape or another polygonal shape.

Figure 16:
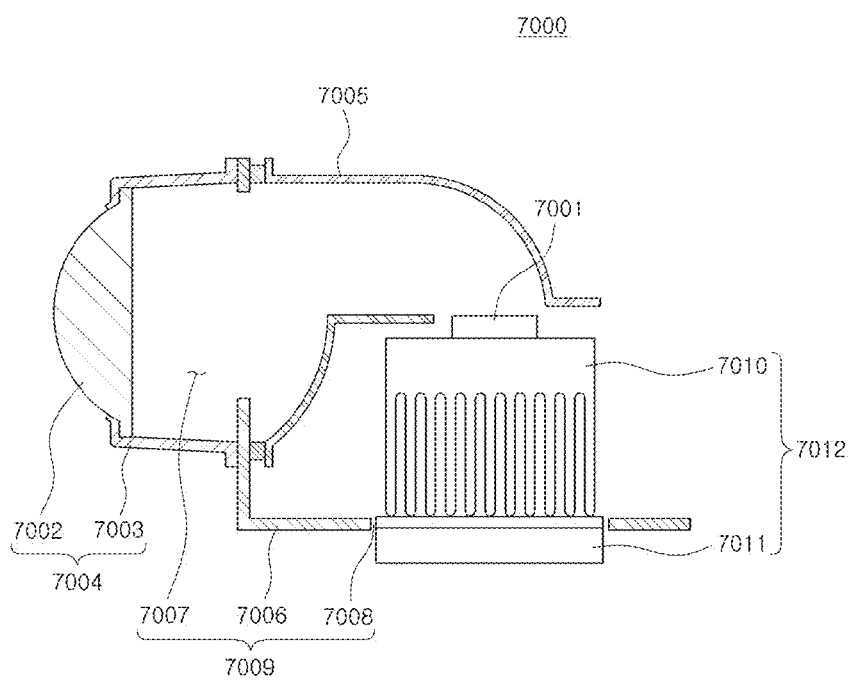
FIG. 16 illustrates an example in which a semiconductor light-emitting device according to an example embodiment of the present disclosure is applied to a headlamp.

FIG. 16 illustrates an example in which a semiconductor light-emitting device according to an example embodiment of the present disclosure is applied to a headlamp.

Referring to FIG. 16, a headlamp 7000 used as a vehicle lamp, or the like, may include a light source 7001, a reflective unit 7005, and a lens cover unit 7004. The lens cover unit 7004 may include a hollow-type guide 7003 and a lens 7002. The light source 7001 may include at least one of the semiconductor light-emitting device packages described with reference to FIGS. 10 and 11. In addition, the headlamp 7000 may further include a heat dissipation unit 7012 dissipating heat generated by the light source 7001 outwardly. In order to effectively dissipate heat, the heat dissipation unit 7012 may include a heat sink 7010 and a cooling fan 7011. In addition, the headlamp 7000 may further include a housing 7009 fixedly supporting the heat dissipation unit 7012 and the reflective unit 7005. The housing 7009 may include a body 7006 and a central hole 7008 formed in one surface thereof, in which the heat dissipation unit 7012 is coupledly installed. The housing 7009 may include a front hole 7007 formed on the other surface integrally connected to the one surface and bent in a right angle direction. The reflective unit 7005 is fixed to the housing 7009. Accordingly, light generated from the light source 7001 may be reflected by the reflective unit 7005, and pass through the front hole 7007 to be emitted outwardly.

As set forth above, a semiconductor light-emitting device having improved distribution of wavelengths of light therefrom and improved light emission efficiency may be provided by reducing variations in widths of a plurality of light-emitting nanostructures.

While example embodiments have been shown and described above, it will be apparent to those skilled in the art that modifications and variations could be made without departing from the scope of the invention as defined by the appended claims.

Additionally, each of the features described above may be combined in any appropriate manner to obtain nanostructure semiconductor light emitting devices, light emitting nanostructures, methods, and/or apparatuses with various combinations of features. In this regard, U.S. application Ser. No. 14/551,978, filed Nov. 24, 2014; Ser. No. 14/723,869, filed May 28, 2015; Ser. No. 13/599,430, filed Aug. 30, 2012; Ser. No. 14/501,232, filed Sep. 30, 2014; U.S. application Ser. No. 14/828,004, filed Aug. 17, 2015; U.S. application Ser. No. 14/833,832, filed Aug. 24, 2015; U.S. application Ser. No. 14/838,322, filed on Aug. 27, 2015; U.S. application Ser. No. 14/838,635, filed on Aug. 28, 2015; U.S. application Ser. No. 14/867,659, filed on Sep. 28, 2015; and U.S. application Ser. No. 14/877,466, filed on Oct. 20, 2015 are each hereby incorporated by reference in their entirety, thereby disclosing additional nanostructure semiconductor light emitting devices, light emitting nanostructures, methods, and/or apparatuses with various additional combinations of features.

What is claimed is:

1. A semiconductor light-emitting device, comprising:
   a base layer formed of a first conductivity-type semiconductor material; and
   a plurality of light-emitting nanostructures on the base layer spaced apart from each other, and including first conductivity-type semiconductor cores, active layers, and
   second conductivity-type semiconductor layers, wherein the first conductivity-type semiconductor cores include rod layers extending upwardly from the base layer, and capping layers on the rod layers
   wherein,
      each rod layer has an individual rod layer height measured from an upper surface of the base layer to a top of the rod layer,
      each capping layer on a each rod layer has an individual capping layer height measured from a top of the rod layer to a top of the capping layer, and
      at least two light-emitting nanostructures, of the plurality of light-emitting nanostructures, include respective rod layers having different respective individual rod layer heights, and
      at least two light-emitting nanostructures, of the plurality of light-emitting nanostructures, include respective capping layers having different respective individual capping layer heights.

The following is an examiner's statement of reasons for allowance: the prior art teaches A semiconductor light-emitting device, comprising:
a base layer formed of a first conductivity-type semiconductor material; and
a plurality of light-emitting nanostructures on the base layer spaced apart from each other, and including first conductivity-type semiconductor cores, active layers, and
second conductivity-type semiconductor layers, wherein the first conductivity-type semiconductor cores include rod layers extending upwardly from the base layer, and capping layers on the rod layers
wherein,
each rod layer has an individual rod layer height measured from an upper surface of the base layer to a top of the rod layer,
   each capping layer on a each rod layer has an individual capping layer height measured from a top of the rod layer to a top of the capping layer (see previous Office Action).

However, the prior art does not explicitly teach nor render obvious all the limitations above and additionally at least two light-emitting nanostructures, of the plurality of light-emitting nanostructures, include respective rod layers associated with having different respective individual rod layer heights, and at least two light-emitting nanostructures, of the plurality of light-emitting nanostructures, include respective capping layers associated with having different respective individual capping layer heights.

2. The semiconductor light-emitting device of claim 1, wherein heights from an upper surface of the base layer to tops of the capping layers in the plurality of light-emitting nanostructures deviate from each other according to at least one of manufacturing techniques and tolerances associated with the plurality of light-emitting nanostructures.

3. The semiconductor light-emitting device of claim 1, wherein heights of capping layers of adjacent light-emitting nanostructures are inversely proportional to a distance between the adjacent light-emitting nanostructures.

4. The semiconductor light-emitting device of claim 1, wherein a standard deviation of widths of the first conductivity-type semiconductor cores in the plurality of light-emitting nanostructures is 3% or less of an average width thereof.

5. The semiconductor light-emitting device of claim 4, wherein the standard deviation of widths of the first conductivity-type semiconductor cores is 10 nm or less.

6. The semiconductor light-emitting device of claim 4, wherein the plurality of light-emitting nanostructures are arranged at different distances in different regions.

7. The semiconductor light-emitting device claim 1, wherein the plurality of light-emitting nanostructures include bodies having a hexagonal prism shape, and upper tips having a hexagonal pyramid shape on the bodies, and
the capping layers configure portions of the bodies and the upper tips.

8. The semiconductor light-emitting device of claim 7, wherein the rod layers and capping layers in the bodies have inclined side surfaces.

9. The semiconductor light-emitting device of claim 7, wherein the plurality of light-emitting nanostructures further include a high resistance layer contacting the active layers on the upper tips thereof.

10. The semiconductor light-emitting device of claim 1, wherein the capping layers extend upwardly of the rod layers and include portions whose widths discontinuously change.

11. The semiconductor light-emitting device of claim 1, wherein the first conductivity-type semiconductor cores further include cover layers outside of the rod layers and the capping layers.

12. The semiconductor light-emitting device of claim 11, wherein the plurality of light-emitting nanostructures include bodies having a hexagonal prism shape, and upper tips having a hexagonal pyramid shape on the bodies, and
the cover layers in the bodies have thicknesses in lower portions greater than thicknesses in upper portions.

13. The semiconductor light-emitting device of claim 1, wherein the rod layers and the capping layers are formed of nitride-based semiconductor materials having different compositions.

14. The semiconductor light-emitting device of claim 1, wherein the rod layers and the capping layers include impurities having different concentration levels.

15. The semiconductor light-emitting device of claim 1, wherein the rod layers and the capping layers have different degrees of crystallinity.

* * * * *

UNITED STATES PATENT AND TRADEMARK OFFICE
CERTIFICATE OF CORRECTION

PATENT NO. : 9,595,637 B2
APPLICATION NO. : 14/920509
DATED : March 14, 2017
INVENTOR(S) : Hyun Seong Kum et al.

Page 1 of 1

It is certified that error appears in the above-identified patent and that said Letters Patent is hereby corrected as shown below:

In the Claims

Column 24, Claim 1 should read:

1. A semiconductor light-emitting device, comprising:
   a base layer formed of a first conductivity-type semiconductor material; and
   a plurality of light-emitting nanostructures on the base layer spaced apart from each other, and including first conductivity-type semiconductor cores, active layers, and second conductivity-type semiconductor layers,
   wherein the first conductivity-type semiconductor cores include rod layers extending upwardly from the base layer, and capping layers on the rod layers,
   wherein,
      each rod layer has an individual rod layer height measured from an upper surface of the base layer to a top of the rod layer,
      each capping layer on each rod layer has an individual capping layer height measured from a top of the rod layer to a top of the capping layer,
      at least two light-emitting nanostructures, of the plurality of light-emitting nanostructures, include respective rod layers having different respective individual rod layer, and
      at least two light-emitting nanostructures, of the plurality of light-emitting nanostructures, include respective capping layers having different respective individual capping layer heights.

Signed and Sealed this
Thirtieth Day of May, 2017

Michelle K. Lee
*Director of the United States Patent and Trademark Office*